United States Patent
Liao et al.

(10) Patent No.: US 10,170,440 B2
(45) Date of Patent: Jan. 1, 2019

(54) SEMICONDUCTOR DEVICE AND A METHOD OF MANUFACTURING THEREOF

(71) Applicant: EPISTAR CORPORATION, Hsinchu (TW)

(72) Inventors: Shih-An Liao, Hsinchu (TW); Shau-Yi Chen, Hsinchu (TW); Ming-Chi Hsu, Hsinchu (TW); Chun-Hung Liu, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/459,310

(22) Filed: Mar. 15, 2017

(65) Prior Publication Data

US 2017/0271290 A1  Sep. 21, 2017

(30) Foreign Application Priority Data

Mar. 15, 2016 (TW) .............................. 105107908 A

(51) Int. Cl.
*H01L 23/48* (2006.01)
*H01L 23/00* (2006.01)
(Continued)

(52) U.S. Cl.
CPC .............. *H01L 24/16* (2013.01); *H01L 24/06* (2013.01); *H01L 24/13* (2013.01); *H01L 24/29* (2013.01); *H01L 24/73* (2013.01); *H01L 24/83* (2013.01); *H01L 33/62* (2013.01); *H01L 24/20* (2013.01); *H01L 24/32* (2013.01); *H01L 24/48* (2013.01); *H01L 33/30* (2013.01); *H01L 33/647* (2013.01); *H01L 2224/04105* (2013.01); *H01L 2224/0612* (2013.01); *H01L 2224/13309* (2013.01); *H01L 2224/13311* (2013.01); *H01L 2224/13313* (2013.01); *H01L 2224/13339* (2013.01); *H01L 2224/13499* (2013.01);
(Continued)

(58) Field of Classification Search
CPC ......... H01L 24/16; H01L 24/06; H01L 24/13; H01L 24/29; H01L 24/83
USPC .................................................. 257/737, 778
See application file for complete search history.

(56) References Cited

U.S. PATENT DOCUMENTS

| | | | | |
|---|---|---|---|---|
| 4,945,391 A | * | 7/1990 | Yagoura ............... | G02B 6/4204 257/433 |
| 5,607,227 A | * | 3/1997 | Yasumoto .......... | H04N 1/00909 257/100 |
| 5,629,566 A | * | 5/1997 | Doi ....................... | H01L 21/563 257/711 |
| 6,344,156 B1 | * | 2/2002 | Yamada ..................... | C09J 7/00 252/512 |

(Continued)

FOREIGN PATENT DOCUMENTS

TW        423166        9/1999

*Primary Examiner* — Nitin Parekh
(74) *Attorney, Agent, or Firm* — Juan Carlos A. Marquez; Marques IP Law Office, PLLC

(57) ABSTRACT

A semiconductor device comprises a semiconductor die, comprising a stacking structure, a first bonding pad, and a second bonding pad on a top surface of the stacking structure, wherein a shortest distance between the first bonding pad and the second bonding pad is less than 150 μm; a carrier comprising a connecting surface; a third bonding pad and a fourth bonding pad on the connecting surface of the carrier; and a conductive connecting layer comprising a current conductive area between the first bonding pad and the third bonding pad and between the second bonding pad and the fourth bonding pad.

20 Claims, 9 Drawing Sheets

(51) Int. Cl.
*H01L 33/62* (2010.01)
*H01L 33/30* (2010.01)
*H01L 33/64* (2010.01)

(52) U.S. Cl.
CPC ............... *H01L 2224/165* (2013.01); *H01L 2224/16058* (2013.01); *H01L 2224/16105* (2013.01); *H01L 2224/16227* (2013.01); *H01L 2224/294* (2013.01); *H01L 2224/2929* (2013.01); *H01L 2224/2939* (2013.01); *H01L 2224/29309* (2013.01); *H01L 2224/29311* (2013.01); *H01L 2224/29313* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29499* (2013.01); *H01L 2224/32225* (2013.01); *H01L 2224/48227* (2013.01); *H01L 2224/73204* (2013.01); *H01L 2224/8388* (2013.01); *H01L 2224/83121* (2013.01); *H01L 2224/83191* (2013.01); *H01L 2224/83192* (2013.01); *H01L 2224/83203* (2013.01); *H01L 2224/83851* (2013.01); *H01L 2224/83862* (2013.01); *H01L 2224/83886* (2013.01); *H01L 2924/1033* (2013.01); *H01L 2924/10329* (2013.01); *H01L 2924/10331* (2013.01); *H01L 2924/12041* (2013.01); *H01L 2924/15156* (2013.01)

(56) References Cited

U.S. PATENT DOCUMENTS

| | | | | |
|---|---|---|---|---|
| 6,365,840 | B1* | 4/2002 | Honda | H01L 21/563 174/255 |
| 6,512,183 | B2* | 1/2003 | Mitani | H05K 3/321 174/257 |
| 6,946,601 | B1* | 9/2005 | Lee | H01L 25/16 174/534 |
| 7,714,444 | B2* | 5/2010 | Nakatani | B23K 1/0016 257/772 |
| 7,909,480 | B2 | 3/2011 | Kang et al. | |
| 8,444,882 | B2 | 5/2013 | Kanisawa et al. | |
| 8,692,390 | B2* | 4/2014 | Wu | H01L 23/49811 257/778 |
| 2002/0048847 | A1* | 4/2002 | Tsunoi | H01L 21/563 438/108 |
| 2002/0100974 | A1* | 8/2002 | Uchiyama | H01L 24/11 257/737 |
| 2002/0159242 | A1* | 10/2002 | Nakatani | H01L 21/561 361/760 |
| 2003/0038366 | A1* | 2/2003 | Kozono | H01L 23/3128 257/723 |
| 2006/0007086 | A1* | 1/2006 | Rhee | G02F 1/13452 345/87 |
| 2007/0001313 | A1* | 1/2007 | Fujimoto | H01L 24/11 257/778 |
| 2009/0029504 | A1* | 1/2009 | Paik | H01L 21/563 438/108 |
| 2014/0346684 | A1* | 11/2014 | Kojima | H01L 24/32 257/783 |
| 2015/0061095 | A1* | 3/2015 | Choi | H01L 24/20 257/675 |

\* cited by examiner

Step a.
Preparing a semiconductor die 1 comprising a stacking structure 11, a first bonding pad 112 and a second bonding pad 113 on a surface 111 of the stacking structure 11, and a shortest distance between the first bonding pad 112 and the second bonding pad 113 is not more than 150 μm.

Step b.
Preparing a carrier 2 comprising a surface 21, a third bonding pad 22 and a fourth bonding pad 23 on a surface 21 of the carrier 2.

Step c.
Coating a conductive agent on the surface 111 of the semiconductor die 1 or the surface 21 of the carrier 2, wherein the conductive agent covers the first bonding pad 112 and the second bonding pad 113, or the conductive agent covers the third bonding pad 22 and fourth bonding pad 23.

Step d.
Aligning the first bonding pad 112 and the second bonding pad 113 of the semiconductor die 1 to the third bonding pad 22 and the fourth bonding pad 23 of the carrier 2 respectively.

Step e.
Curing the conductive agent to form a conductive connecting layer 3 comprising a current conductive area 31 and a current blocking area 32 between the surfaces 111 and 21.

FIG. 7

SEMICONDUCTOR DEVICE AND A METHOD OF MANUFACTURING THEREOF

TECHNICAL FIELD

This present application relates to a semiconductor device, more particularly relates to a connecting structure of the semiconductor device and a method of manufacturing the semiconductor device.

DESCRIPTION OF BACKGROUND ART

The present disclosure provides a semiconductor device comprises III-V group elements, such as gallium phosphide (GaP), gallium arsenide (GaAs) or gallium nitride (GaN). The semiconductor device could be light-emitting device (LED), power device or solar cell, wherein the LED comprises a p-type semiconductor layer, an n-type semiconductor layer and an active region between the p-type semiconductor layer and the n-type semiconductor layer. When applying an electric field, electrons and holes provided by the n-type semiconductor layer and the p-type semiconductor layer recombine in the active region and the electrical energy is transferred to the optical energy.

In order to enhance the electrical efficiency and the heat dissipation efficiency, the flip chip type LED is produced. However, the yield of manufacturing the flip chip type LED by the conventional method is decreased and the reliability of the flip chip type LED may also be affected for being incorporated in the compact electrical product.

SUMMARY OF THE DISCLOSURE

The present disclosure provides a semiconductor device comprising a semiconductor die, comprising a stacking structure, a first bonding pad, and a second bonding pad on a top surface of the stacking structure, wherein a shortest distance between the first bonding pad and the second bonding pad is less than 150 μm; a carrier comprising a connecting surface; a third bonding pad and a fourth bonding pad on the connecting surface of the carrier; and a conductive connecting layer comprising a current conductive area between the first bonding pad and the third bonding pad and between the second bonding pad and the fourth bonding pad.

BRIEF DESCRIPTION OF THE DRAWINGS

FIG. 7 shows a flow chart of a method of manufacturing the semiconductor device disclosed in the present disclosure.

DETAILED DESCRIPTION OF THE PRESENT DISCLOSURE

Figure 1:
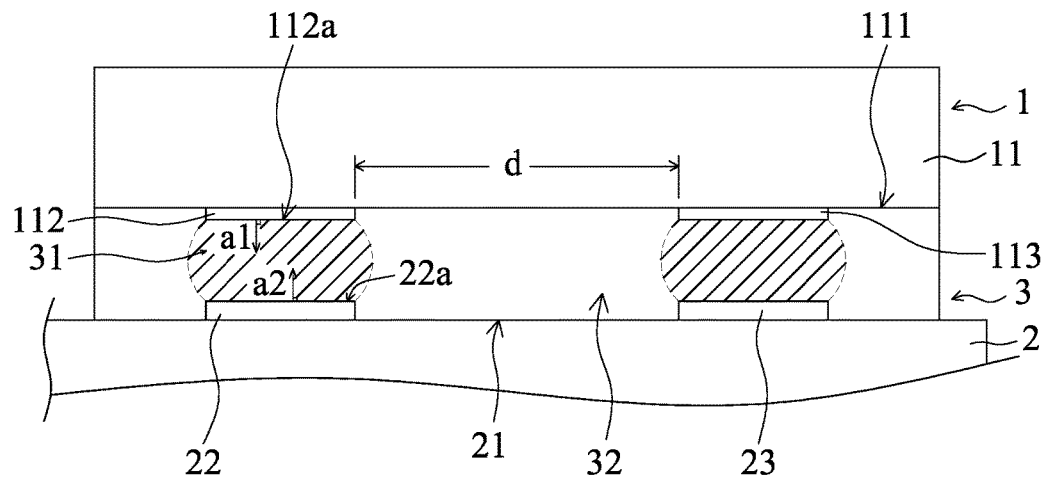
FIG. 1 is a schematic drawing of a semiconductor device in the present disclosure.

The embodiment of the application is illustrated in detail, and is plotted in the drawings. The same or the similar parts are illustrated in the drawings and the specification with the same reference numeral.

FIG. 1 shows a schematic drawing of the semiconductor device 100 disclosed in the present disclosure. The semiconductor device 100 comprises a semiconductor die 1 and a carrier 2. A conductive connecting layer 3 locates between the semiconductor die 1 and the carrier 2 to electrically connect the semiconductor die 1 with the carrier 2. The semiconductor die 1 comprises a first bonding pad 112 and a second bonding pad 113, and the carrier 2 comprises a third bonding pad 22 and a fourth bonding pad 23. The conductive connecting layer 3 comprises a current conductive area 31 and a current blocking area 32, and the current conductive area 31 locates between the first bonding pad 112 and the third bonding pad 22, and between the second bonding pad 113 and the fourth bonding pad 23.

More specifically, the semiconductor die 1 is formed by cutting a semiconductor wafer during manufacturing procedure. To fit in the compact electronic products, the semiconductor die 1 disclosed in one embodiment of the present disclosure could have a size smaller than 150 mil², for example. On the other hand, a shortest distance d between the first bonding pad 112 and the second bonding pad 113 is less than 150 μm, such as the shortest distance d is between 50 μm and 100 μm. The semiconductor die 1 can be light-emitting diode, a power device or a solar cell. The semiconductor die 1 comprises a stacking structure 11 having a top surface 111, the first bonding pad 112 and the second bonding pad 113 on the top surface 111. The first bonding pad 112 comprises a first bonding surface 112a substantially parallel with the top surface 111 of the semiconductor die 1. The first bonding surface 112a comprises a first normal direction a1 perpendicular with the first bonding surface 112a. Generally, the first bonding surface 112a has larger area than the other surfaces of the first bonding pad 112, and a material of the outer surfaces of the first bonding pad 112 and the second bonding pad 113 can be gold (Au), silver (Ag), copper (Cu), tin (Sn), nickel (Ni) or an alloy of the above metals. In one embodiment, the semiconductor die 1 can be a bare semiconductor die without package material, a die with phosphor layer conformably formed on a surface of bare semiconductor die, or a die with package material formed by chip scale package (CSP) technology.

In FIG. 1, the carrier 2 comprises a connecting surface 21, the third bonding pad 22 and the fourth bonding pad 23 located on the connecting surface 21 and protruded from the connecting surface 21. The third bonding pad 22 comprises a second bonding surface 22a substantially parallel to the connecting surface 21 of the carrier 2, and the second bonding surface 22a has larger area than the other surfaces of the third bonding pad 22. A material of the outer surfaces of the third bonding pad 22 and the fourth bonding pad 23 can be gold (Au), silver (Ag), copper (Cu), tin (Sn), nickel (Ni) or an alloy of the above metals. The third bonding pad 22 and the fourth bonding pad 23 substantially align to the first bonding pad 112 and the second bonding pad 113 respectively. In one embodiment, after connecting the semiconductor die 1 and the carrier 2 through the conductive connecting layer 3, the first normal direction a1 of the first bonding pad 112 is substantially parallel to the second normal direction a2 of the third bonding pad 22. That is, the first bonding pad 112 and the second bonding pad 113 face the third bonding pad 22 and the fourth bonding pad 23 respectively when bonding the semiconductor die 1 and the carrier 2 via the conductive connecting layer 3 in order to enable the current to flow between the semiconductor die 1 and the carrier 2. More specifically, there is an angle between the first normal direction a1 and the second normal direction a2, and the angle is between 160 degrees to 200 degrees. To be more specific, the angle is 180 degrees. In another embodiment, after connecting the semiconductor die 1 and the carrier 2 through the conductive connecting layer 3, a distance between the top surface 111 of the stacking structure 11 and the connecting surface 21 of the carrier 2 is preferably less than 60 µm in order to effectively decrease the height of the semiconductor device 100 for fitting the compact device and thinner device. The carrier 2 is designated to electrically connect to an external power supplier. For example, the carrier 2 can be a packaging carrier or printed circuit board (PCB). The current flows to the conductive connecting layer 3 through the third bonding pad 22 and the fourth bonding pad 23 of the carrier 2, and then passes to the semiconductor die 1 via the first bonding pad 112 and the second bonding pad 113 to drive the semiconductor die 1.

Figure 2:
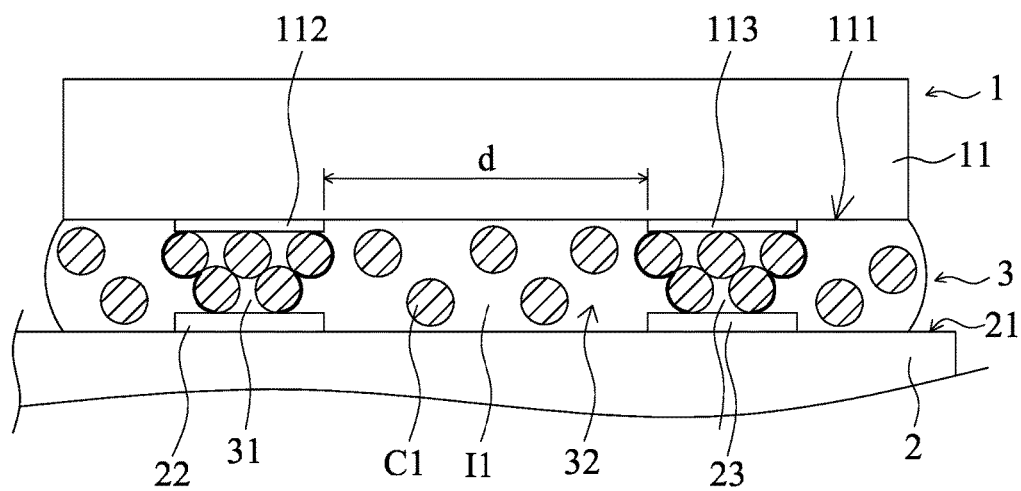
FIG. 2 shows a cross section of a semiconductor device in accordance with the first embodiment of the present disclosure.

FIG. 2 shows a cross section of the semiconductor device 100 in accordance with the first embodiment of the present disclosure. The current conductive area 31 locates between the first bonding pad 112 and the third bonding pad 22, and between the second bonding pad 113 and the fourth bonding pad 23. The current blocking area 32 locates outside of the current conductive area 31. For example, the current blocking area 32 locates between the top surface 111 of the stacking structure 11, which is devoid of the first bonding pad 112 and the second bonding pad 113, and the connecting surface 21 of the carrier 2, which is devoid of the third bonding pad 22 and the fourth bonding pad 23. In other words, the current blocking area 32 is defined by the first bonding pad 112, the second bonding pad 113, the third bonding pad 22, the fourth bonding pad 23, the top surface 111 of the stacking structure 11 and the connecting surface 21 of the carrier 2. The current blocking area 32, for example, surrounds and covers the current conductive area 31. In the first embodiment, the top surface 111 of the semiconductor die 1 is substantially parallel to the connecting surface 21 of the carrier 2 and the structure of the semiconductor device 100 is described above. Besides, in order to decrease the overall thickness of the semiconductor device 100, a thickness of the current conductive area 31 can be less than 40 µm. That is, the distance between the first bonding pad 112 and the third bonding pad 22, or the distance between the second bonding pad 113 and the fourth bonding pad 23 is less than 40 µm for being able to be incorporated in the compact semiconductor device. The conductive connecting layer 3 comprises a conductive material C1 and an insulating material I1, and the current conductive area 31 and the current blocking area 32 comprise different contents of the conductive material C1. More specifically, a content of the conductive material C1 in the current conductive area 31 is higher than that in the current blocking area 32. For example, in the first embodiment shown in FIG. 2, the content of the conductive material C1 in the current conductive area 31 is between 7% and 75%, and preferably between 15% and 30%. The content of the conductive material C1 in the current blocking area 32 is between 2% and 50%, and preferably between 3% and 10%. It should be noted that, "the content of the conductive material C1" in the disclosure is defined to be the content of the conductive material in a specific area in a cross section view of microscopic image of the semiconductor device 100. Particularly, the "content" of the conductive material C1 is defined by the percentage of a total area of the conductive material C1 in a specific area such as the current blocking area 32 or the current conductive area 31 in the cross-section microscopic image of the semiconductor device 100. For example, the total area of the conductive material C1 in the current blocking area 32 is A, and a total area of the current blocking area 32 is B, and the content of the conductive material C1 in the current blocking area 32 is (A/B)×100%. The above definition can also be suitable to define "the content of the conductive material" in the following disclosure.

In FIG. 2, the shape of the conductive material C1 in the first embodiment is sphere or granular. The content of the conductive material C1 in the current conductive area 31 is between 7% and 75% so the first bonding pad 112 electrically connects to the third bonding pad 22 and the second bonding pad 113 electrically connects to the fourth bonding pad 23 via the conductive material C1, and therefore, the current flows to the semiconductor die 1 from the carrier 2. Moreover, the current blocking area 32 comprises a small amount of the conductive material C1, and the quantity of the conductive material C1 is not sufficient to form conductive connection between the semiconductor die 1 and the carrier 2 via the current blocking area 32. The content of the conductive material C1 in the current blocking area 32 can be between 2% and 50%, and preferably between 3% and 10%. More specifically, the electrical connection cannot be formed due to insufficient conductive material C1 between the first bonding pad 112 and the second bonding pad 113, between the third bonding pad 22 and the fourth bonding pad 23, between the first bonding pad 112 and the fourth bonding pad 23, and between the third bonding pad 22 and the second bonding pad 113. Therefore, the semiconductor die 1 is electrically isolated to the carrier 2 in the current blocking area 32 for avoiding current shortage caused by current flows between the first bonding pad 112 and the second bonding pad 113, and between the third bonding pad 22 and the fourth bonding pad 23.

Furthermore, the conductive material C1 can be metal or alloy with a melting point higher than 300° C., such as gold (Au), copper (Cu), aluminum (Al), nickel (Ni), silver (Ag), or the alloy composed at least two metals described above. The insulating material I1 can be thermosetting or thermoplastic polymer. For example, the insulating material I1 can be epoxy, silicone, poly(methyl 2-methylpropenoate) and episulfide. In the present embodiment, the insulating material I1 is a thermosetting material and having a curing temperature, and the melting point of the conductive material C1 is higher than the curing temperature of the insulating material I1. Moreover, a structure of the conductive material C1 in the embodiment is granular and comprises a grain size which defined by a diameter of the conductive material C1. The grain size can be between 5 µm to 50 µm. The shortest distance d between the first bonding pad 112 and the second bonding pad 113 is preferably more than double of the grain size to prevent the current shortage caused by the conductive material C1 contacts to the first bonding pad 112 and the second bonding pad 113 when conducting a heating step and/or a pressurizing step in the procedure of manufacturing the semiconductor device 100. As described above, the shortest distance d is not more than 150 µm for being able to be incorporated in the compact electrical product. The conductive material C1 can be a core-shell structure. In one embodiment, the conductive material C1 comprises a conductive core and a insulating layer covering the conductive core, wherein the material of the insulating layer is not limited to be the same or different from the insulating material I1. In another embodiment, the conductive material C1 comprises an insulating core and a conductive layer covering the insulating core.

Figure 3:
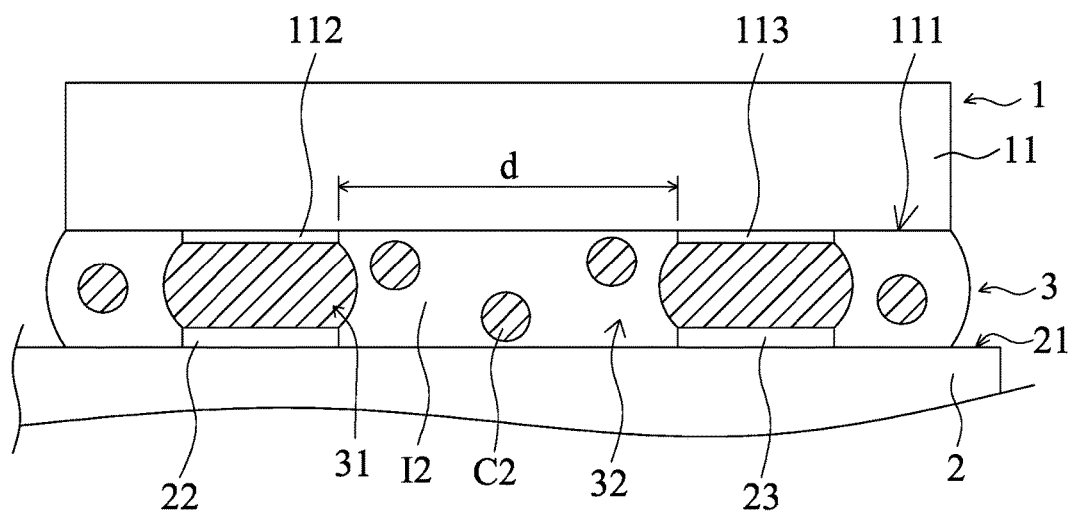
FIG. 3 shows a cross section of a semiconductor device in accordance with the second embodiment of the present disclosure.

FIG. 3 shows a cross section of a semiconductor device 100 in accordance with the second embodiment of the present disclosure. The conductive connecting layer 3 comprises a conductive material C2 and an insulating material I2, and the current conductive area 31 and the current blocking area 32 comprise different contents of the conductive material C2. The content of the conductive material C2 in the current conductive area 31 is higher than 75%, or the current conductive area 31 is preferably devoid of the insulating material I2. The content of the conductive material C2 in the current blocking area 32 is lower than 40% but not equal to zero. That is, the current blocking area 32 comprises small amount of the conductive material C2. For example, the content of the conductive material C2 in the current blocking 32 is between 0.1% and 40%, and preferably between 2% and 10%. The content of the insulating material I2 in the current blocking area 32 is higher than 60%, and preferably between 60% and 99.9%, and more preferably between 90% and 98%. In one embodiment, the current blocking area 32 comprises 10% to 40% of conductive material C2 and 60% to 90% of insulating material I2, and preferably, the current blocking area 32 comprises 20% to 30% of conductive material C2 and 70% to 80% of insulating material I2. It should be noted that, the elements of the semiconductor device 100 and the connection thereof in the present embodiment is similar with that of the first embodiment shown in FIG. 2, however, the content of the conductive material C2 in the current blocking area 32 in the present embodiment is lower than that of the conductive material C1 in the current blocking area 32 in the first embodiment. Under the circumstances, the current is much harder to pass the current blocking area 32 in the second embodiment than in the first embodiment. The dispersion of the conductive material C2 in the current blocking area 32 shown in FIG. 3 is much sparser than that of the conductive material C1 in the current blocking area 32 shown in FIG. 2, and therefore, a better blocking effect can be achieved in the second embodiment since the lower quantity of the conductive material C2 in the current blocking area 32 is unable to form electrical connection between the first bonding pad 112 and the second bonding pad 113, between the third bonding pad 22 and the fourth bonding pad 23, between the first bonding pad 112 and the fourth bonding pad 23, and between the second bonding pad 113 and the third bonding pad 22.

More specifically, the conductive material C2 comprises a metal or an alloy with a melting point lower than 300° C., such as bismuth (Bi), tin (Sn), silver (Ag) or indium (In), or the alloy composed of at least two metals described above, for example Sn—Bi—Ag alloy. When the conductive material C2 is an alloy, the melting point of the conductive material C2 means the eutectic point of the alloy. The insulating material I2 can be a thermosetting polymer, such as epoxy, silicone, poly(methyl 2-methylpropenoate) and episulfide. The insulating material I2 has a curing temperature, and the melting point of the conductive material C2 is lower than the curing temperature of the insulating material I2 in the present embodiment. The method of manufacturing the semiconductor device 100 comprises a heating step, and the detail steps will be described later. Before heating the conductive connecting layer 3, a structure of the conductive material C2 in the conductive connecting layer 3 is granular and comprises a grain size of between 5 µm and 50 µm, for example. The shortest distance d between the first bonding pad 112 and the second bonding pad 113 is preferably more than or equal to double of the grain size, and not more than 150 µm. The reason for the specific value of the shortest distance d is already presented above. In one embodiment, the conductive material C2 comprises a first metal and a second metal, and more specifically, the single grain of the conductive material C2 comprises the first metal and the second metal, and a melting point of the first metal is lower than that of the second metal. Besides, a content of the first metal is lower than that of the second metal in the single grain of the conductive material C2. For example, the single grain of the conductive material C2 comprises 42 wt % of the first metal and 58 wt % of the second metal. In one embodiment, the first metal is tin (melting point is about 231° C.) and the second metal is bismuth (melting point is about 271° C.), and the melting point of the conductive material C2 is the eutectic point of the two metal, which is about 139° C. In another embodiment, the conductive material C2 is Sn—Ag—Cu alloy, and the melting point of the alloy is about 217° C. In another embodiment, the conductive material C2 is a core-shell structure and comprises an insulating core and a metal layer covering the insulating core. The material of the insulating core can but not limited to be the same as or different from the insulating material I2.

It should be noted that, the shape of the conductive material C2 in the current conductive area 31 is bulk, and the shape of the conductive material C2 is granular in the current blocking area 32 in the semiconductor device 100 of the second embodiment shown in FIG. 3. However, the shape of the conductive material C2 in the current conductive area 31 is granular, so as the shape of the conductive material C2 in the current blocking area 32 is in the semiconductor device 100 of the first embodiment shown in FIG. 2. More specifically, the conductive material C2 in the current conductive area 32 forms a continuous dispersion between the first bonding pad 112 and the third bonding pad 22, and the second bonding pad 113 and the fourth bonding pad 23 in the second embodiment. Comparing to the conductive material C1 in the current conductive area 32 in the first embodiment, the conductive material C2 is more impact and comprises less voids or almost no void in the current conductive area 32 in the second embodiment. The conductive material C2 with bulk shape is produced by heating and/or pressurizing the conductive material C2 with granular shape, and the original (granular) conductive material C2 melts during the heating and/or pressurizing steps, so that the conductive material C2 forms continuous dispersion between the bonding pads 112, 22, and the bonding pads 113, 23. On the contrary, the current conductive area 32 in the first embodiment is formed by physical contact of the conductive material C1, and therefore the current conductive area 32 in the first embodiment comprises several voids since the conductive material C1 is devoid of melting and mixing together. The different shapes and dispersity mechanisms of the conductive material C1, C2 in the two embodiments is attributed to the difference of the material of the conductive connecting layer 3. The dispersity mechanisms will be introduced in the later paragraph.

Figure 4:
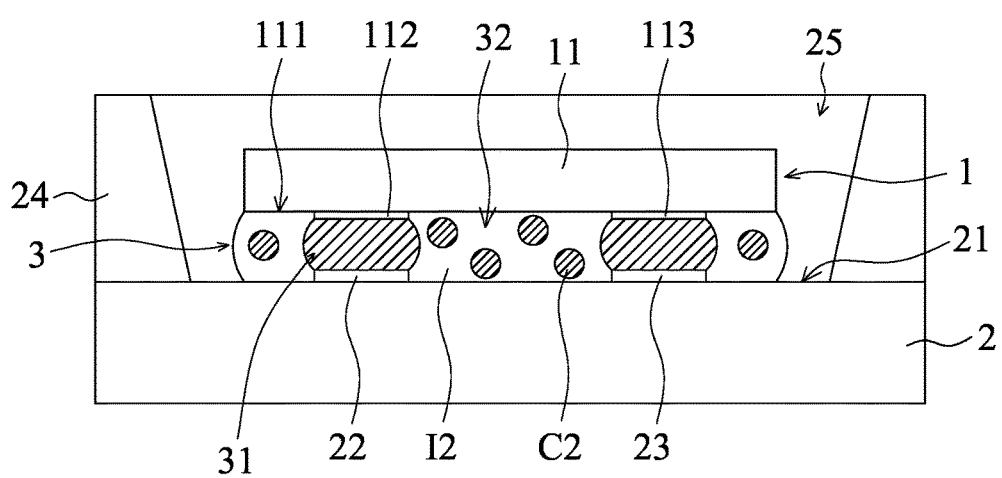
FIG. 4 shows a cross section of a semiconductor device in accordance with the third embodiment of the present disclosure.

FIG. 4 shows a cross section of a semiconductor device 100 in accordance with the third embodiment of the present disclosure. The elements of the semiconductor device 100 and the connection thereof in the present embodiment are similar with that of the second embodiment. However, the semiconductor device 100 in the present embodiment further comprises a reflective wall 24 protruding from the connecting surface 21 of the carrier 2. The reflective wall 24 surrounds the third bonding pad 22 and the fourth bonding pad 23, and the reflective wall 24 and the connecting surface 21 of the carrier 2 collectively define a concave 25 surrounded by them. The semiconductor die 1 locates in the concave 25. When the semiconductor die 1 is a light-emitting die (the light-emitting die can be a light-emitting diode), the reflective wall 24 has the reflectivity higher than 80% to reflect a light emitted by the light-emitting die. The reflective wall 24 achieves high reflectivity to light by its own material or structure. Alternatively, the reflective wall 24 has high reflectivity to the light emitted by the light-emitting die through coating a reflective material on a surface facing the concave 25. Therefore, the light emitted by the light-emitting die can be concentrated and the luminance of the light-emitting die can be increased. The material of the reflective wall 24 comprises metal, alloy or silicone mixed with reflective particles, wherein the reflective particles comprise silicon oxide ($SiO_x$), tin oxide ($TiO_x$) or boron nitride (BN).

Figure 5:
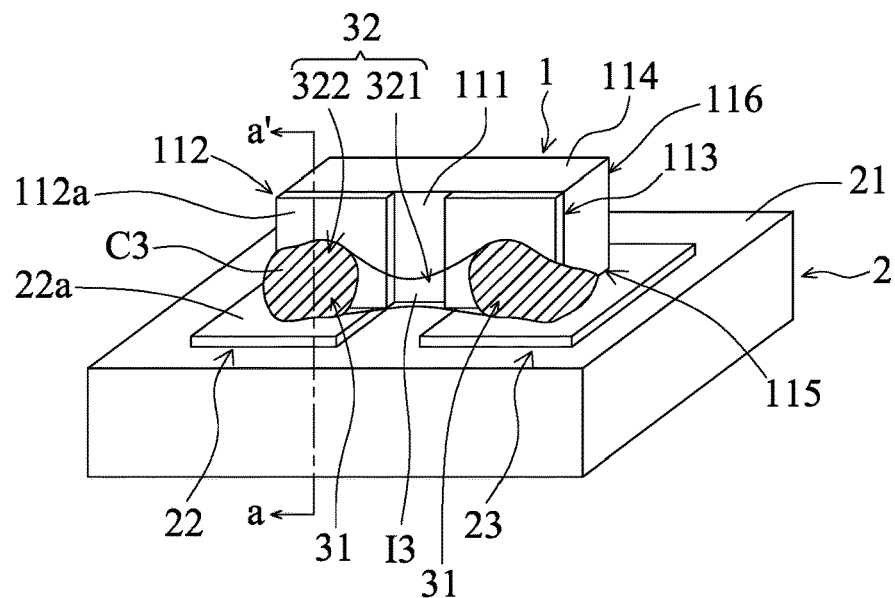
FIG. 5 shows a semiconductor device in accordance with the fourth embodiment of the present disclosure.
Figure 6:
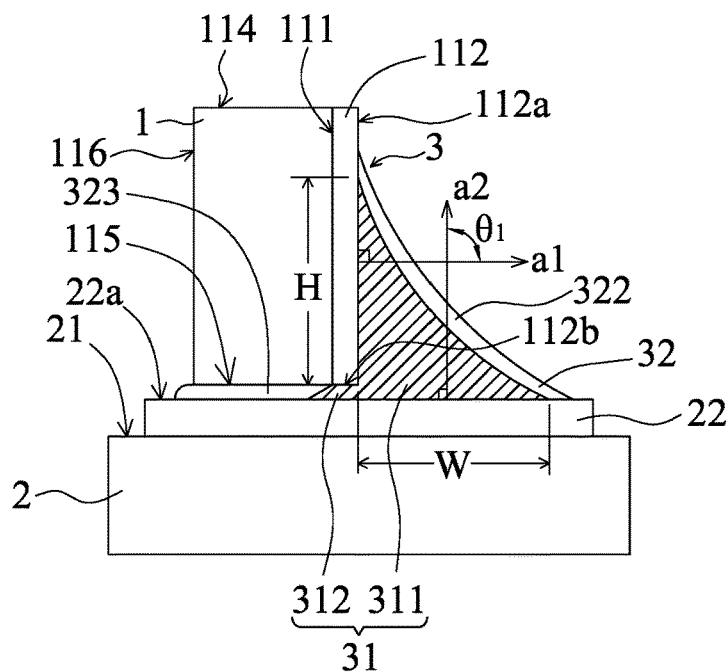
FIG. 6 shows a cross section of the semiconductor device along the line a-a' shown in FIG. 5.

FIG. 5 shows a cross section of a semiconductor device 100 in accordance with the fourth embodiment of the present disclosure. The semiconductor device 100 comprises a semiconductor die 1, a carrier 2 and a conductive connecting layer 3 between the semiconductor die 1 and the carrier 2 to enable the current to flow between the semiconductor die 1 and the carrier 2. The semiconductor die 1 comprises a top surface 111, a first bonding pad 112 and second bonding pad 113 on the top surface 111. The carrier 2 comprises a connecting surface 21, a third bonding pad 22 and fourth bonding pad 23 on the connecting surface 21. The conductive connecting layer 3 comprises a current conductive area 31 and a current blocking area 32. The current conductive area 31 locates between the first bonding pad 112 and the third bonding pad 22, and between the second bonding pad 113 and fourth bonding pad 23. The current blocking area 32 locates outside of the current conductive area 31. The elements of the semiconductor device 100 and the connection thereof in the present embodiment are similar with that shown in the second embodiment. For example, the semiconductor device 100 in the fourth embodiment, the first bonding pad 112 comprises a first bonding surface 112a, and the third bonding pad 22 comprises a second bonding surface 22a. The first bonding surface 112a and the second bonding surface 22a are substantially and respectively parallel with the top surface 111 of the semiconductor die 1 and the connecting surface 21 of the carrier 2. The current conductive area 31 locates between the first bonding surface 112a and the second bonding surface 22a. However, the difference between the present embodiment and the second embodiment is the relationship of the first bonding surface 112a of the first bonding pad 112 of the semiconductor die 1 and the second bonding surface 22a of the third bonding pad 22 of the carrier 2. More specifically, the top surface 111 of the semiconductor die 1 is substantially parallel with the connecting surface 21 of the carrier 2, and the first normal direction a1 of the first bonding pad 112 is substantially parallel with the second normal direction a2 of the third bonding pad 22 in the second embodiment. However, in the fourth embodiment, the top surface 111 of the semiconductor die 1 is not parallel with the connecting surface 21 of the carrier 2, or the top surface 111 of the semiconductor die 1 is perpendicular with the connecting surface 21 of the carrier 2. In FIG. 6, the first bonding surface 112a of the first bonding pad 112 comprises a first normal direction a1, and the second bonding surface 22a of the third bonding pad 22 comprises a second normal direction a2. A first angle θ1 between the first normal direction a1 and the second normal direction a2 is not 180 degrees. For example, the first angle θ1 is about between 60 and 150 degrees, and preferably between 80 and 100 degrees. More preferably, the first angle θ1 is about 90 degrees. In the semiconductor device 100 of the present embodiment, though there is the first angle θ1 described above formed between the first normal direction a1 and the second normal direction a2 because the top surface 111 of the semiconductor die 1 is not parallel with the connecting surface 21 of the carrier 2, the conductive connecting layer 3 can still be formed between the semiconductor die 1 and the carrier 2. Consequently, the current can flow between the first bonding pad 112 and the third bonding pad 22, and between the second bonding pad 113 and the fourth bonding pad 23. In the meantime, a thickness of the semiconductor device 100 can be effectively reduced. The semiconductor device 100 can be applied in the backlight module application which has strict requirement of the volume of the semiconductor device 100.

FIG. 6 shows a cross section of the semiconductor device 100 along the line a-a' shown in FIG. 5. More specifically, the semiconductor die 1 in the present embodiment comprises a first side surface 114 and a second side surface 115 opposite to the first side surface 114. The first side surface 114 and the second side surface 115 connect to the top surface 111, and the first side surface 114 is farer to the carrier 2 than the second side surface 115 is. The second side surface 115 faces and connects to the connecting surface 21 of the carrier 2. The semiconductor die 1 further comprises a main light-extracting face 116 connecting to the first side surface 114 and the second side surface 115. The conductive connecting layer 3 locates between the connecting surface 21 of the carrier 2 and the top surface 111 of the semiconductor die 1, wherein the current conductive area 31 of the conductive connecting layer 3 locates between the first bonding pad 112 and the third bonding pad 22, and between the second bonding pad 113 and fourth bonding pad 23. The current blocking area 32 is outside of the current conductive area 31 of the conductive connecting layer 3, and the current blocking area 32 preferably covers the outer side of the current conductive area 31. In FIG. 6, the current conductive area 31 comprises a first conducting part 311 and a second conducting part 312. The first conducting part 311 locates between the first bonding pad 112 and the third bonding pad 22, and between the second bonding pad 113 and the fourth bonding pad 23, and the second conducting part 312 locates between a side surface 112b of the first bonding pad 112 and the third bonding pad 22, and a side surface (not shown) of the second bonding pad 113 and the fourth bonding pad 23. The side surface 112b of the first bonding pad 112 connects to the first bonding surface 112a and the second side surface 115, and preferably, the first conducting part 311 connects to the second conducting part 312. The current blocking area 32 comprises a first insulating part 321, a second insulating part 322, and a third insulating part 323. The first insulating part 321 locates among the top surface 111 which is devoid of the first bonding pad 112 and the second bonding pad 113, the connecting surface 21 which is devoid of the third bonding pad 22 and the fourth bonding pad 23, and the current conductive area 31. The second insulating part 322 covers the outer side of the current conductive area 31 (shown in FIG. 6). The third insulating part 323 locates between the second side surface 115 and the second bonding surface 22a and is adjacent and connects to the second conducting part 312. More preferably, the first insulating part 321 of the current blocking area 32 connects to the second insulating part 322 and the third insulating part 323. Similar to the second embodiment, the conductive connecting layer 3 comprises a conductive material C3 and an insulating material I3. The contents of the conductive material C3 in the current conductive area 31 and the current blocking area 32 are different, and the content of the conductive material C3 in the current conductive area 31 is more than that in the current blocking area 32. In one embodiment, the content of the conductive material C3 in the current conductive area 31 is higher than 75%, and the content of the conductive material C3 in the current blocking area 32 is preferably lower than 40%. For example, the content of the conductive material C3 in the current blocking area 32 is between 0.1% and 40%, or between 2% and 10%. The conductive material C3 and insulating material I3 in the present embodiment are preferably the same as the conductive material C2 and the insulating material I2 in the second embodiment respectively. FIG. 6 shows a connection of the current conductive area 31 and the first bonding pad 112 or the second bonding pad 113 of the semiconductor die 1 comprises a highest height H, and a connection of the current conductive area 31 and the third bonding pad 22 or fourth bonding pad 23 of the carrier 2 comprises a widest width W. In one embodiment, the highest height H is between 130 μm and 200 μm, and the widest width W is between 150 μm and 300 μm. The contents of the insulating material I3 in the first insulating part 321, the second insulating part 322, and the third insulating part 323 are more than 60%, and preferably between 60% and 99.9%, and more preferably between 90% and 98%. In one embodiment of the disclosure, the second insulating part 322 and the third insulating part 323 are devoid of the conductive material C3. In one embodiment of the disclosure, the second conducting part 312 comprises the insulating material I3.

FIG. 7 shows a flow chart of a method of manufacturing the semiconductor device 100 disclosed in the present disclosure, which comprises the following steps:

Step a. preparing a semiconductor die 1 comprising a stacking structure 11, a first bonding pad 112, and a second bonding pad 113 on a top surface 111 of the stacking structure 11, wherein a shortest distance between the first bonding pad 112 and the second bonding pad 113 is less than 150 μm;

Step b. preparing a carrier 2 comprising a connecting surface 21, a third bonding pad 22 and a fourth bonding pad 23 on a connecting surface 21 of the carrier 2;

Step c. coating a conductive agent on the top surface 111 of the semiconductor die 1 or the connecting surface 21 of the carrier 2, wherein the conductive agent covers the first bonding pad 112 and the second bonding pad 113, or the conductive agent covers the third bonding pad 22 and fourth bonding pad 23;

Step d. aligning the first bonding pad 112 and the second bonding pad 113 of the semiconductor die 1 to the third bonding pad 22 and the fourth bonding pad 23 of the carrier 2 respectively;

Step e. curing the conductive agent to form a conductive connecting layer 3 comprising a current conductive area 31 and a current blocking area 32 between the surfaces 111 and 21, wherein the current conductive area 31 locates between the first bonding pad 112 and third bonding pad 22, and between the second bonding pad 113 and the fourth bonding pad 23, and the current blocking area 32 is formed between the surfaces 111 and 21 and locates outside of the current conductive area 31.

Preferably, in the above step c, the conductive agent continuously covers the first bonding pad 112, the second bonding pad 113, and the top surface 111 of the semiconductor die 1 between the first bonding pad 112 and the second bonding pad 113 at the same time. Alternatively, the conductive agent continuously covers the third bonding pad 22, the fourth bonding pad 23, and the connecting surface 21 of the carrier 2 between the third bonding pad 22 and the fourth bonding pad 23 at the same time. It is convenient and simple to continuously cover the above elements. The method described above is suitable to decrease the shortest distance between the first bonding pad 112 and the second bonding pad 113 to 15~150 μm in order to meet the requirement of a compact semiconductor device 100. In the above step c, the conductive agent is coated to the first bonding pad 112 and the second bonding pad 113 with separate areas respectively by utilizing a printing plate with openings. In the embodiment of the present disclosure, the tolerance of aligning the openings of the printing plate to the first bonding pad 112 or the second bonding pad 113 is larger, and the yield loss caused by the poor alignment can be effectively reduced. Therefore, the yield of producing the semiconductor device 100 with compact size can be improved when utilizing the printing plate in the method. Furthermore, in the above step e, the conductive agent can be cured by various ways, such as heating, cooling, or adding the material which can initiate the curing effect. If necessary, an appropriate physical property, such as pressure, can also be applied to the conductive agent. As long as the conductive agent is cured and forms the current conductive area 31 in the area described above, any possible modifications without departing from the spirit of the disclosure should be covered by the disclosure.

The step e comprises curing the conductive agent or a conductive film by heating and pressurizing at the same time when manufacturing the semiconductor device 100 in the first embodiment. In FIGS. 2 and 7, the current conductive area 31 and the current blocking area 32 are formed by curing the conductive agent in the semiconductor device 100 of the first embodiment. The content of the conductive material C1 in the current conductive area 31 is between 7% and 75%, and the content of the conductive material C1 in the current blocking area 32 is between 2% to 50%. The conductive agent comprises a conductive material C1 and an insulating material I1, and the properties of them are described above. Briefly, the insulating material I1 in the embodiment is a thermosetting material having a curing temperature, and the melting point of the conductive material C1 is higher than the curing temperature of the insulating material I1, and preferably, the curing temperature of the insulating material I1 is higher than the room temperature so that the conductive agent is fluid at the room temperature. The conductive material C1 and the insulating material I1 are evenly mixed together before curing the conductive agent; and then, the top surface 111 of the semiconductor die 1 and the connecting surface 21 of the carrier 2 are closer to each other by applying a pressure on them. At this time, since a distance between the first bonding pad 112 and the third bonding pad 22 is smaller than a distance between the top surface 111 of the semiconductor die 1 and the connecting surface 21 of the carrier 2, or a distance between the second bonding pad 113 and the fourth bonding pad 23 is smaller than that between the top surface 111 of the semiconductor die 1 and the connecting surface 21 of the carrier 2, the conductive agent in the current conductive area 31 is firstly surrounded by the bonding pads 112, 22 and 113, 23. Therefore, the volume of the conductive agent is reduced and a current conductive path is formed between the first bonding pad 112 and the third bonding pad 22 aligned with the first bonding pad 112 by contacting the conductive material C1 deposited therebetween. Also, a current conductive path is formed between the second bonding pad 113 and the fourth bonding pad 23 aligned with the third bonding pad 113 by contacting the conductive material C1 deposited therebetween. Thus, the current conductive area 31 is formed. The current blocking area 32 has larger space than the current conductive area 31 since the current blocking area 32 is devoid of the bonding pads 112, 113, 22 and 23 protruding from the surfaces 111, 21. The conductive material C1 disperses in the current blocking area 32 without forming continuous current conductive path between the bonding pads 112 and 113, 22 and 23, and therefore, the current is unable to flow within the current blocking area 32. The insulating material I1 is cured and confines the conductive material C1 when heating the conductive agent to a temperature higher than the curing temperature of the insulating material I1. Thus, the dispersity of the conductive material C1 in the current conductive area 31 and the current blocking area 32 is fixed. In another embodiment, the conductive agent can be replaced by conductive film (not shown). The conductive film presents solid state at room temperature and comprises a conductive material and an insulating material like the conductive agent described above. However, the difference between the conductive agent and the conductive film is that, the insulating material in the conductive film is thermoplastic material and has a melting point higher than room temperature, and the conductive film is shaped as a solid sheet. In the embodiment, the step e further comprises heating the insulating material to melt it, and pressurizing the first bonding pad 22 and the third bonding pad 112, and the second bonding pad 23 and the fourth bonding pad 113 in order to form a current conductive path in the current conductive area 31. Then, the insulating material is cooled to a temperature lower than the melting point of the insulating material to cure the conductive film again, thus the dispersity of the conductive material in the current conductive area 31 and the current blocking area 32 is fixed. The conductive film comprises the melting point, such as between 140° C. and 200° C. Moreover, the structural strength of the semiconductor device 100 can be enhanced and the undesirable current conduction can be avoided when the insulating material fills in the current blocking area 32. Besides, the cracks and damages of the semiconductor die 1 caused by a stress occurred on the void between the bonding pads, 112, 113, 22, 23 during the manufacturing process can be prevented. Besides, when the conductive material C1 is a core-shell structure and comprises a conductive core and an insulating layer covering the conductive core, the insulating layer can be fractured by pressurizing and curing the conductive agent, and the conductive core is exposed and contacts first bonding pad 112 and the second bonding pad 22. In this way, not only the conductive material C1 could evenly disperse in the insulating material I1 before curing the conductive agent, but the undesirable conductive can be avoided along the horizontal direction where is devoid of being pressurized when curing the conductive agent.

The step e comprises curing the conductive agent or conductive film by heating when manufacturing the semiconductor device 100 in the second embodiment. The pressurizing procedure can be added to the method depending on the situation. In FIGS. 3 and 7, the conductive agent comprises a conductive material C2 and an insulating material I2. The melting point of the conductive material C2 is lower than the curing temperature of the insulating material I2, and the properties of the conductive material C2 and the insulating material I2 are described above. The current conductive area 31 and the current blocking area 32 are formed after curing the conductive agent based on the property of the conductive agent in the present embodiment. More specifically, the conductive material C2 and the insulating material I2 are evenly mixed together before curing the conductive agent, and a structure of the conductive material C2 comprises grain shape. Then, the conductive agent is coated between the top surfaces 111 and the connecting surface 21, and the conductive agent preferably continuously covers the first bonding pad 112, the second bonding pad 113, and the top surface 111 of the semiconductor die 1 between the first bonding pad 112 and the second bonding pad 113. Alternatively, the conductive agent continuously covers the third bonding pad 22, the fourth bonding pad 23 and the connecting surface 21 of the carrier 2 between the third bonding pad 22 and the fourth bonding pad 23. After that, the conductive agent is heated to a temperature higher than the melting point of the conductive material C2. For example, the heating temperature is between 140 and 180° C. Since the materials of the bonding pads 112, 113, 22, 23 and the conductive material C2 are metal or alloy and the conductive material C2 can have good wetting property with the material of the bonding pads 112, 113, 22, 23, the conductive material C2 can freely flow within the conductive agent and be attracted to gather between the first bonding pad 112 and the third bonding pad 22, and between the second bonding pad 113 and the fourth bonding pad 23 when the heating temperature is above the melting point of the conductive material C2 and below the curing temperature of the insulating material I2. In other words, before curing step, the structure of the conductive material C2 have grain shape, and then multiple structure of conductive material C2 are melted and gathered to form a bulk shape. Thus, the content of the conductive material C2 in the current conductive area 31 is higher than 75%. However, the content of the conductive material C2 in the area outside of the current conductive area 31 is lower since the conductive material C2 flow and gather to the current conductive area 31. In the present embodiment, the content of the conductive material C2 in the current blocking area 32 is between 0.1% and 40%, while the content of the insulating material I2 in the current blocking area is between 60% and 99.9%. Then, curing the insulating material I2 by heating the conductive agent to a temperature higher than the curing temperature of the insulating material I2. The conductive material C2 is already gathered between the first bonding pad 112 and the third bonding pad 22, and between the second bonding pad 113 and the fourth bonding pad 23 in the previous step. The dispersity of the conductive material C2 in the current conductive area 31 and the current blocking area 32 is fixed since the cured insulating material I2 can confine a flow region of the melted conductive material C2.

As FIGS. 6 and 7 show, in the step c of the method for manufacturing the semiconductor device 100 in the fourth embodiment, the conductive agent preferably continuously covers the first bonding pad 112, the second bonding pad 113 of the semiconductor die 1 and the top surface 111 therebetween, or the conductive agent continuously covers the third bonding pad 22, the fourth bonding pad 23 and the connecting surface 21 of the carrier 2. The step d comprises aligning the semiconductor die 1 and the carrier 2 while the second side surface 115 faces the connecting surface 21 of the carrier 2. Under the circumstances, the conductive agent covers the second side surface 115, and the side surfaces of the first bonding pad 112 and the second bonding pad 113 connect to the surfaces of the third bonding pad 22 and the fourth bonding pad 23 respectively. The first angle θ1 is formed between the first normal direction a1 of the first bonding surface 112a and second normal direction a2 of the second bonding surface 22a. The conductive agent covers the second side surface 115 of the semiconductor die 1 and the carrier 21. In step e, the conductive agent is cured by heating to 140° C.~180° C. The conductive agent comprises the conductive material C3 and the insulating material I3, which is similar with the conductive agent in the second embodiment. Since good surface wetting property between the conductive material C3 and the bonding pads 112, 113, 22 and 23, the conductive grains of the conductive material C3 are heated and gathered together to form a bulk between the first bonding pad 112 and the third bonding pad 22, and between the second bonding pad 113 and the fourth bonding pad 23. After that, the insulating material I3 is cured by being heated to a temperature higher than the curing temperature. In this way, most of the conductive material C3 is confined between the first bonding pad 112 and the third bonding pad 22, and between the second bonding pad 113 and the fourth bonding pad 23, and therefore the current conductive area 32 is formed.

Figure 8:
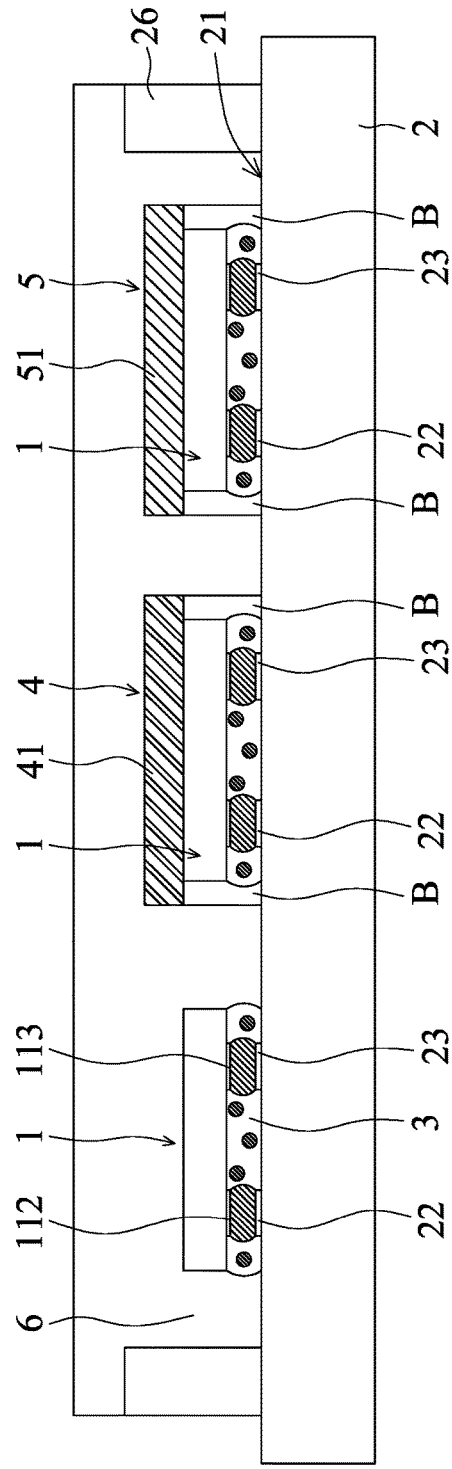
FIG. 8 shows a cross section of a semiconductor device in accordance with the fifth embodiment of the present disclosure.

FIG. 8 shows a cross section of a semiconductor device 100 in accordance with the fifth embodiment of the present disclosure. The semiconductor device 100 comprises a plurality of semiconductor dies 1 and a carrier 2, wherein the plurality of semiconductor dies 1 are light-emitting dies. More specifically, the semiconductor device 100 comprises the carrier 2, a first light-emitting die 1, a second light-emitting chip 4, a third light-emitting chip 5 and a reflecting wall 26 projected from a connecting surface 21 of the carrier 2 and having similar light-reflecting properties with reflective wall 24 described above. The reflecting wall 26 surrounds the first light-emitting die 1, the second light-emitting chip 4 and the third light-emitting chip 5. The structures of the first light-emitting die 1, the second light-emitting chip 4 and the third light-emitting chip 5 are similar with the semiconductor die 1 in the first and second embodiments. Three pairs of the third bonding pad 22 and the fourth bonding pad 23 are deposited on the connecting surface 21 of the carrier 2. The bonding pads 112, 113 of the first light-emitting die 1 connect to one pair of the third bonding pad 22 and the fourth bonding pad 23 on the connecting surface 21 of the carrier 2 by the method disclosed in the first and second embodiments. The second light-emitting chip 4 and the third light-emitting chip 5 also locate on the connecting surface 21 of the carrier 2. The two bonding pads of the second light-emitting chip 4 and the third light-emitting chip 5 can be connected to the other two pairs of the third bonding pad 22 and the fourth bonding pad 23 on the connecting surface 21 of the carrier 2 by the method disclosed in the first and second embodiments. Alternatively, the two bonding pads of the second light-emitting chip 4 and the third light-emitting chip 5 can be connected to the other two pairs of the third bonding pad 22 and the fourth bonding pad 23 on the connecting surface 21 of the carrier 2 by metal bonding method. Therefore, the electrical connection is formed among the carrier 2, the first light-emitting die 1, the second light-emitting chip 4, and the third light-emitting chip 5. The first light-emitting die 1, the second light-emitting chip 4, and the third light-emitting chip 5 emit a first light, a second light, and a third light respectively when current flows among the carrier 2 and the first light-emitting die 1, the second light-emitting chip 4, and the third light-emitting chip 5. The first light, the second light, and the third light generate white light when mixing together. The second light-emitting chip 4 shown in FIG. 8 comprises a first light-emitting die 1 emitting a first light and a second wavelength converting layer 41 formed on a light-extraction face of the first light-emitting die 1. The third light-emitting chip 5 comprises a first light-emitting die 1 emitting a first light and a third wavelength converting layer 51 formed on a light-extraction face of the first light-emitting die 1. In the embodiment, all of the first light-emitting die 1, the second light-emitting chip 4, and the third light-emitting chip 5 connect to the carrier 2 by the conductive agent, wherein the first light-emitting die 1, the second light-emitting chip 4, and the third light-emitting chip 5 are preferably devoid of substrate structure and bond to the carrier 2 by a flip-chip bonding form. The structure of the light-emitting die 1 will be described later. In one embodiment, the first light emitted by the first light-emitting die 1 is blue light. The second wavelength converting layer 41 of the second light-emitting chip 4 comprise a material which is able to convert the blue light to a green light, such as phosphors or quantum dots, and the second light described above is the green light. The third wavelength converting layer 51 of the third light-emitting chip 5 comprise a material which is able to convert the blue light to a red light, such as phosphors or quantum dots, and the third light described above is the red light. It should be noted that, the semiconductor device 100 optionally comprises light-blocking walls B surround the second light-emitting chip 4 and the third light-emitting chip 5 respectively. More specifically, the light-blocking wall B surrounds a side wall of a stacking structure of the second light-emitting chip 4 and the second wavelength converting layer 41, and the light-blocking wall B surrounds a side wall of a stacking structure of the third light-emitting chip 5 and the third wavelength converting layer 51. In this way, the wavelength conversion efficiency for the light emitted by the second light-emitting chip 4 through being converted by the second wavelength converting layer 41, and the wavelength conversion efficiency for the light emitted by the third light-emitting chip 5 through being converted by the third wavelength converting layer 51 can be enhanced. Besides, the light-blocking wall B could avoid the first light from leaking out from the side of the second light-emitting chip 4 to excite the neighboring third light-emitting chip 5, or avoid the first light from leaking out from the side of the third light-emitting chip 5 to excite the neighboring second light-emitting chip 4. Therefore, an undesirable mixing of lights can be avoided.

Figure 9:
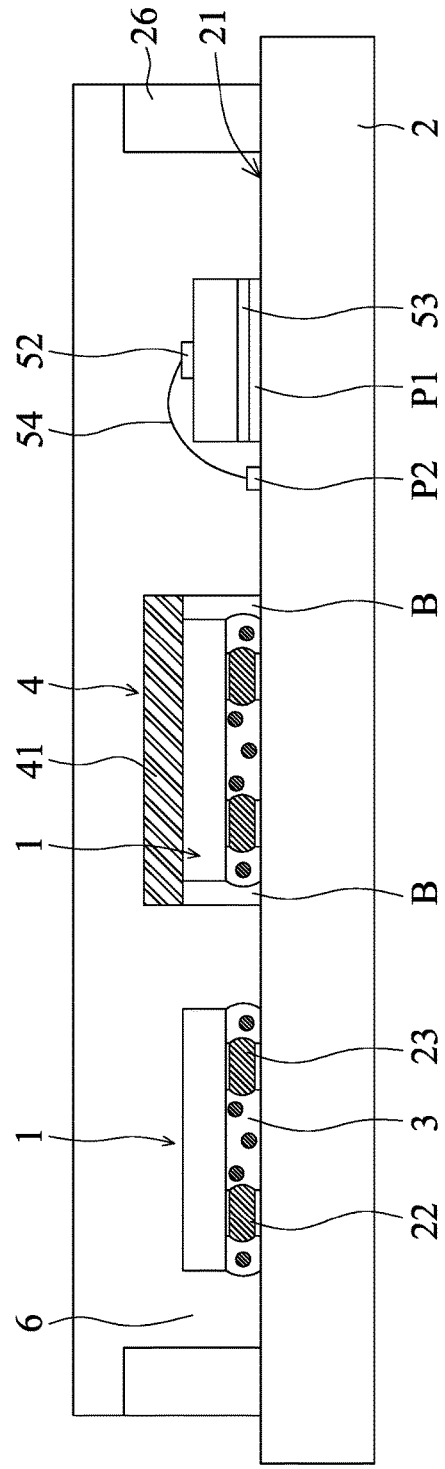
FIG. 9 shows a cross section of a semiconductor device in accordance with the sixth embodiment of the present disclosure.

FIG. 9 shows a cross section of a semiconductor device 100 in accordance with the sixth embodiment of the present disclosure. Similar with FIG. 8, the first light-emitting die 1 and the second light-emitting chip 4 connect to the carrier 2 by the method disclosed in the first and second embodiments. The third light-emitting chip 5 in the present embodiment is a vertical structure, which is different from the embodiment shown in FIG. 8. The third light-emitting chip 5 comprises a first electrode 52 and a second electrode 53, and the first electrode 52 and a second electrode 53 locate on the opposite sides of the third light-emitting chip 5. The second electrode 53 connects to a bonding pad P1 on the carrier 2 by the method disclosed in the first and second embodiments, while the first electrode 52 electrically connects to a bonding pad P2 on the carrier 2 through a metal line 54 by the method of face-up wire bonding. Alternatively, in another embodiment, the third light-emitting chip 5 is a horizontal structure and comprises a first electrode 52 and a second electrode 53 locate on the same side of the light-emitting chip 5, and the first electrode 52 and the second electrode 53 electrically connect to the bonding pads on the carrier 2 through two metal lines by the method of face-up wire bonding. The first light-emitting die 1, the second light-emitting chip 4, and the third light-emitting chip 5 emit a first light, a second light, and a third light respectively, and a white light can be generated by mixing the first light, the second light, and the third light. The second light-emitting chip 4 comprises a first light-emitting die 1 emitting the first light and a second wavelength converting layer 41 formed on a light-extraction face of the first light-emitting die 1. The third light-emitting chip 5 is devoid of a third wavelength converting layer 51 and emits the third light. For example, the first light is blue light, the second light is green light, and the third light is red light. In one embodiment, a concave is formed by being surrounded by the reflecting wall 26 and the connecting surface 21 of the carrier 2, and a transparent body 6 is filled in the concave to protect the light-emitting dies 1, 4 and 5. The transparent body 6 can but is not limited to be epoxy, acrylic resin, silicon or the combination thereof. In another embodiment, the material of the transparent body 6 is the same with the insulating materials I1, I2 in the conductive agent and therefore the coefficient of thermal expansion of the transparent body 6 is the same with the insulating materials I1, I2. Under the circumstances, the light-emitting dies 1, 4 and 5 connect to the carrier 2 with higher stability since a stress caused by the expansion or shrink of the transparent body 6 and the conductive agent when operating the semiconductor device 100 can be eliminated.

Figure 10:
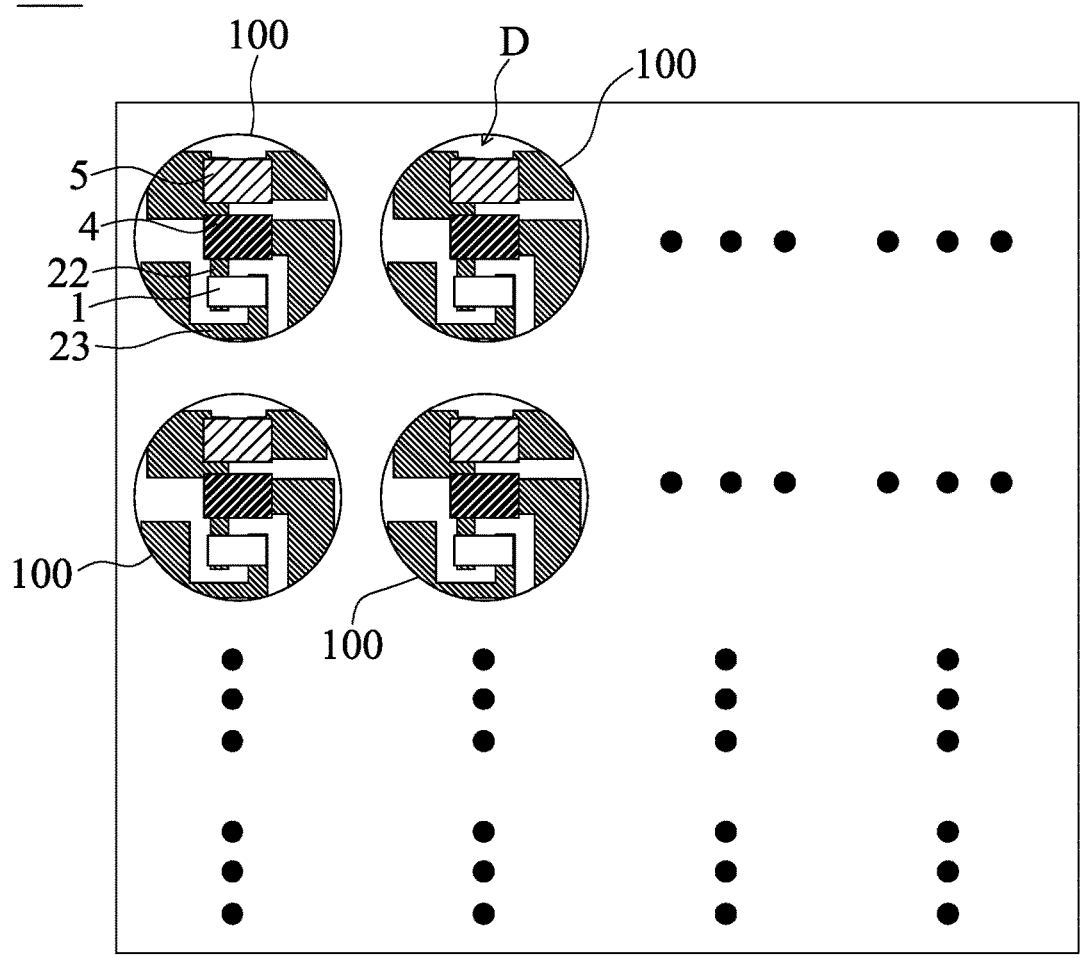
FIG. 10 shows a top view of a light-emitting module including the semiconductor device disclosed in the present disclosure.

FIG. 10 shows a top view of a light-emitting module 200 including the semiconductor device 100 disclosed in the present disclosure. The light-emitting module 200 comprises a plurality of the semiconductor devices 100 shown in FIG. 8 and/or 9. In the embodiment, the plurality of the semiconductor device 100 comprises a common carrier 2 and being arranged to form a two dimensional array. The plurality of the semiconductor devices 100 connect to each other via the reflecting wall 26. The concave surrounded by reflecting wall 26 of the semiconductor device 100 could be circle as shown in the present embodiment, square, or slit depending on the application of the light-emitting module 200. The single concave surrounded by the reflecting wall 26 comprises a concave area D, and the concave area D is preferably between 1 and 20 mm². The light-emitting module 200 can be further applied to display device, such as television screen, cell phone screen, digital billboard, sporting digital signage and so on. The light-emitting module 200 comprises a plurality of the semiconductor device 100 and each of the semiconductor devices 100 is designated to be a pixel. The amount, color and arrangement of the semiconductor device 100 and the distance between neighboring semiconductor devices 100 affect the visual property when the user watches the display device. For example, the display device has higher resolution by utilizing the semiconductor device 100 with small size, since the display device accommodates much amount of the semiconductor device 100 with small size than the semiconductor device 100 with large size.

Figure 11:
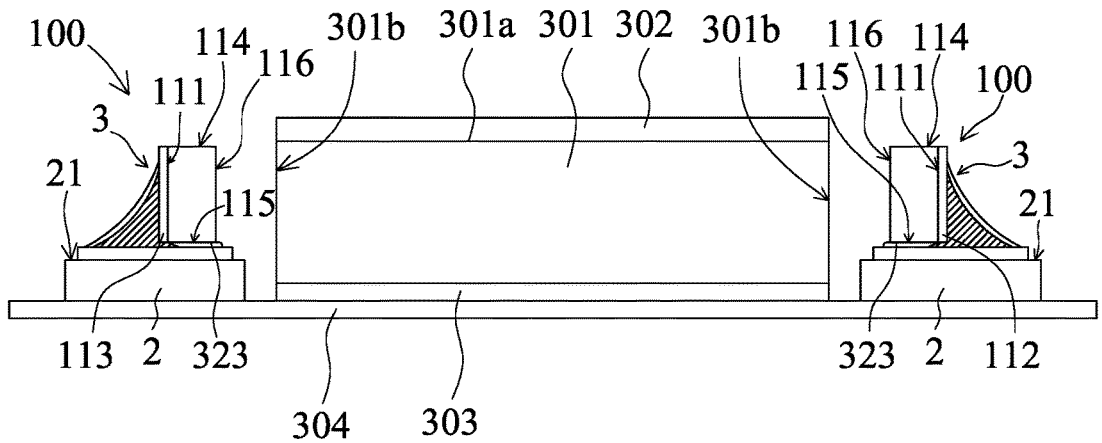
FIG. 11 shows a cross section of another light-emitting module including the semiconductor device disclosed in the present disclosure.
Figure 12:
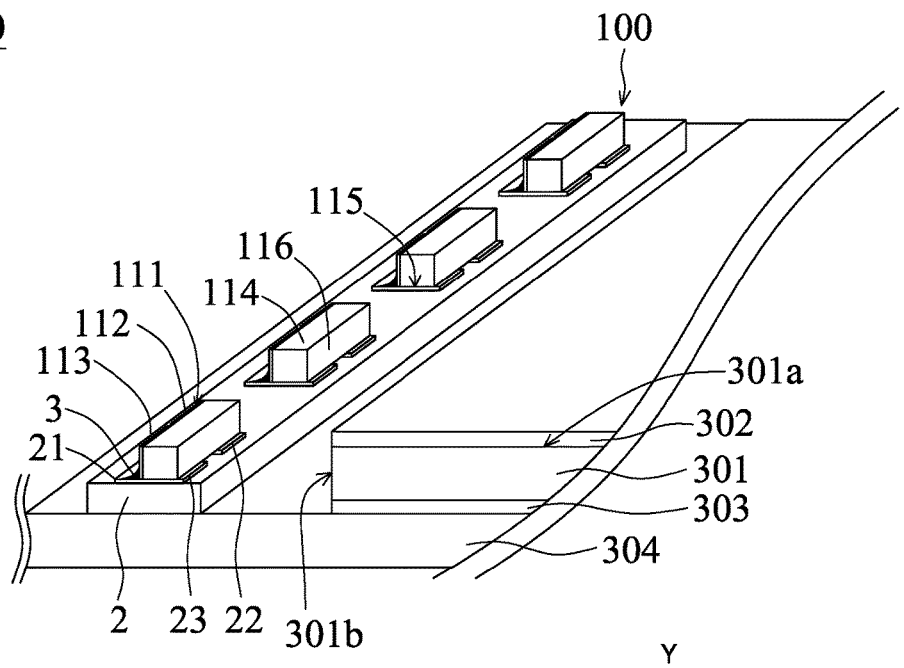
FIG. 12 shows the light-emitting module including the semiconductor device disclosed in the present disclosure.

FIGS. 11 and 12 show another light-emitting module 300 including the semiconductor device 100 disclosed in the present disclosure. In the present embodiment, the light-emitting module 300 is an edge-type light-emitting module and comprises the semiconductor device 100 as shown in FIGS. 5 and 6 of the fourth embodiment, a light guiding board 301, and a diffusion board 302. The light-emitting module 300 comprises a plurality of the semiconductor devices 100. The main light-extraction surface 116 of the semiconductor die 1 is opposite to the top surface 111 with the first bonding pad 112, and the main light-extraction surface 116 locates between the side surface 114 and the second side surface 115. The light guiding board 301 comprises a light-extraction surface 301a and two side surface 301b connecting to the light-extraction surface 301a. Each of the plurality of the semiconductor devices 100 connects to the light guiding board 301 while the main light-extraction surface 116 faces to the two side surface 301b of the light guiding board 301. The diffusion board 302 locates on the light-extraction surface 301a of the light guiding board 301. The light emitted from the light-extraction surface 301a by the semiconductor die 1 proceeds to side surface 301b of the light guiding board 301. Then, the light guiding board 301 guides the light proceeding toward the light-extraction surface 301a and entering the diffusion board 302 in order to evenly disperse the light by the diffusion board 302. The light-emitting module 300 preferably comprises a reflective layer 303 connecting to a surface of the light guiding board 301 which is opposite to the light-extraction surface 301a. The reflective layer 303 reflects the light to the diffusion board 302, and hence, the light uniformity of the light-emitting module 300 can be increased. The light-emitting module 300 further comprises a supporting board 304. The reflective layer 303, the light guiding board 301, the diffusion board 302 and the semiconductor devices 100 locate on the supporting board 304. FIG. 12 is a three-dimensional view of the light-emitting module 300 shown in FIG. 11. The semiconductor device 100 comprises a plurality of the semiconductor dies 1 on the carrier 2, and the plurality of the semiconductor dies 1 arranges along the side surface 301b of the light guiding board 301 and forms a one-dimensional array. Nevertheless, the amount and the arrangement of the semiconductor die 1 of the light-emitting module 300 in the disclosure are not limited to the structure shown in FIG. 12.

Figure 13:
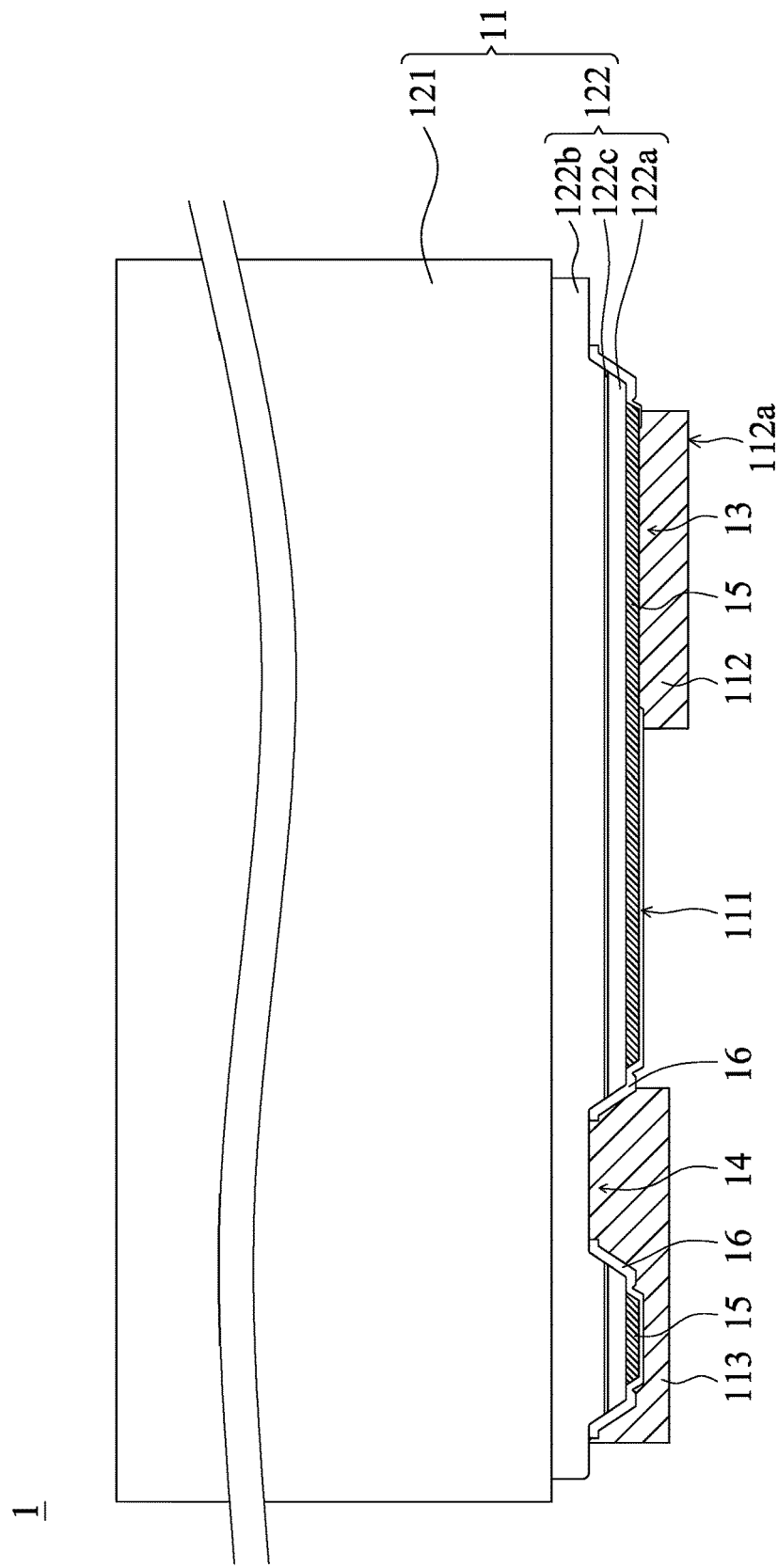
FIG. 13 shows a cross section of a semiconductor die incorporated in the semiconductor device disclosed in the present disclosure.

FIG. 13 shows a cross section of a semiconductor die 1 incorporated in the semiconductor device 100 disclosed in the present disclosure. The semiconductor die 1 can be a flip-chip type light-emitting element. The semiconductor die 1 in the present embodiment can be the semiconductor die 1 shown in FIGS. 1-6, the first light-emitting die 1 and the second light-emitting chip 4 shown in FIGS. 8-9, and the third light-emitting chip 5 shown in FIG. 8. More specifically, the semiconductor die 1 comprises the stacking structure 11, a first bonding pad 112 and the second bonding pad 113 on the top surface 111 of the stacking structure 11. The stacking structure 11 comprises a substrate 121 and a semiconductor stack 122. The substrate 121 is designated to support and carry the semiconductor stack 122. The first bonding pad 112 and the second bonding pad 113 locate on the same side of the semiconductor stack 122 and form a horizontal type semiconductor structure. In one embodiment, the semiconductor stack 122 is among the bonding pads 112, 113, and the substrate 121. The substrate 121 is a transparent substrate. After the semiconductor die 1 connects to the carrier 2, the semiconductor die 1 can emit light from the substrate 121. The transparent substrate comprises but is not limited to sapphire, glass, quartz or other transparent materials.

The semiconductor stack 122 comprises a first semiconductor layer 122a, a second semiconductor layer 122b, and an active layer 122c formed between the first semiconductor layer 122a and the second semiconductor layer 122b. The second semiconductor layer 122b, the active layer 122c, and the first semiconductor layer 122a sequentially form on the substrate 121. The semiconductor stack 122 can be epitaxially grown on the substrate 121. Alternatively, the semiconductor stack 122 is epitaxially grown on a growth substrate, being bonded to the substrate 121, and then the growth substrate is removed through substrate transfer technology. In another embodiment, after the semiconductor stack 122 is epitaxially grown on a growth substrate, the growth substrate is removed. Therefore, the stacking structure 11 which is devoid of any substrate is produced, and the kind of the semiconductor die 1 with thinner thickness can meet the requirement of thinner-device application. For example, the semiconductor die 1 is suitable for back light source of mobile device. The semiconductor stack 122 can be epitaxially grown on the growth substrate by metal organic chemical vapor deposition (MOCVD), molecular beam epitaxy (MBE), physical vapor deposition (PVD) or other methods. The first semiconductor layer 122a and the second semiconductor layer 122b comprise a first conductive type and a second conductive type respectively. The active layer 122c can be a single heterostructure (SH), a double heterostructure (DH), or a multi-quantum well structure (MQW). The first bonding pad 112 and the second bonding pad 113 locate on the first semiconductor layer 122a and the second semiconductor layer 122b respectively. The above transparent substrate comprises a material having a band gap higher than a band gap of the active layer 122c and has a high transparency to the light emitted by the active layer 122c. When the semiconductor stack 122 bonds to the substrate 121 by substrate transfer technology, a transparent adhesive layer (not shown) inserts between the substrate 121 and the semiconductor stack 122, and the transparent adhesive layer can be an organic polymer or an inorganic material, such as oxide, nitride or fluoride.

In FIG. 13, the stacking structure 11 further comprises a reflective layer 15 on the first semiconductor layer 122a and an insulating layer 16 on the reflective layer 15. The semiconductor die 1 further comprises a first channel 13 and a second channel 14, wherein the first channel 13 is formed by removing a part of the insulating layer 16 and exposing the reflective layer 15. The second channel 14 is formed by removing an active layer 122c, a first semiconductor layer 122a, a reflective layer 15 and the insulating layer 16 to expose the second semiconductor layer 122b. The first bonding pad 112 electrically connects to the first semiconductor layer 122a through the first channel 13, and the second bonding pad 113 electrically connects to the second semiconductor layer 122b through the second channel 14. An opening area of the insulating layer 16 on the first channel 13 is smaller than an area of the first bonding pad 112, and an opening area of the insulating layer 16 on the second channel 14 is smaller than an area of the second bonding pad 113. More specifically, the first bonding pad 112 and the second bonding pad 113 electrically connect to the first semiconductor layer 122a and the second semiconductor layer 122b through the first channel 13 and the second channel 14 respectively. A contacting area of the first bonding pad 112 and the semiconductor stack 11 through the opening of the insulating layer 16, and a contacting area of the second bonding pad 113 and the semiconductor stack 11 through the opening of the insulating layer 16 are smaller than the areas of the first bonding pad 112 and the second bonding pad 113 respectively. A current can be introduced into the semiconductor die 1 through the first bonding pad 112 and the second bonding pad 113 with larger sizes, and therefore, the heat dissipation of the semiconductor die 1 can be increased. The reflective layer 16 is designated to reflect the light emitted from the active layer 122c toward the first semiconductor layer 122a to the direction of the substrate 121, and the light-extraction efficiency of the semiconductor die 1 can be enhanced. The structure of the semiconductor die 1 described above is only for illustration and does not intend to limit the structure of the semiconductor die 1. Any possible modifications without departing from the spirit of the disclosure should be covered by the disclosure as long as the shortest distance between the first bonding pad 112 and the second bonding pad 113 of the semiconductor die 1 is less than 150 μm.

Figure 14:
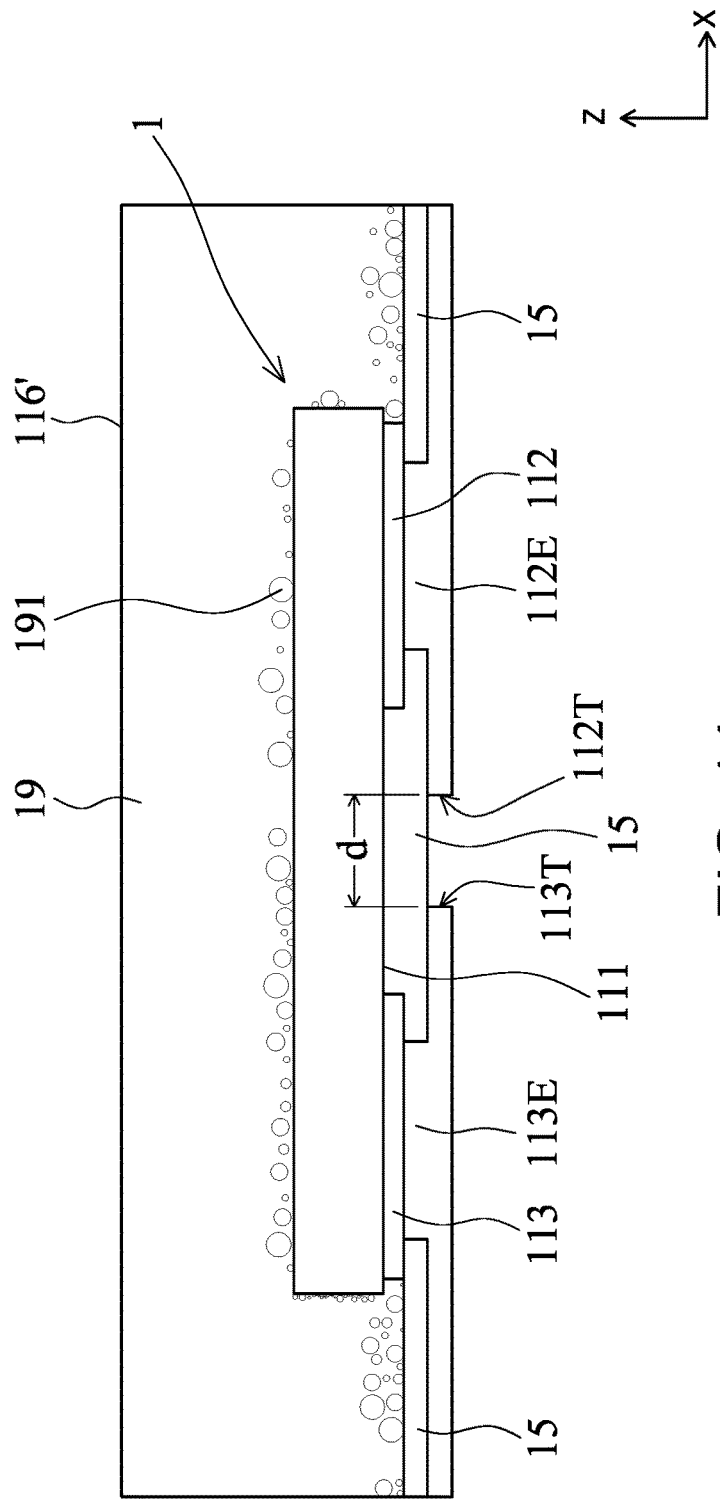
FIG. 14 shows a cross section of another semiconductor die incorporated in the semiconductor device disclosed in the present disclosure.

FIG. 14 shows a cross section of another semiconductor die 1' incorporated in the semiconductor device 100 disclosed in the present disclosure. The semiconductor die 1' comprises package material and is formed by chip-scale-package (CSP). The semiconductor die 1' comprises a semiconductor die 1 shown in FIG. 13, a first bonding pad 112, and a second bonding pad 113 on a top surface 111. The first bonding pad 112 comprises a first metal extending part 112E comprising a first end 112T extending toward the second bonding pad 113. The second bonding pad 113 comprises a second metal extending part 113E comprising a second end 113T extending toward the first bonding pad 112. A shortest distance d between the first end 112 T of the first bonding pad 112 and the second end 113T of the second bonding pad 113 is less than 150 μm. The semiconductor die 1' further comprises a package body 19 covering the semiconductor die 1. The first metal extending part 112E and the second metal extending part 113E protrude to the top surface 111 of the semiconductor die 1 and extend to the package body 19. A main light-extraction surface 116' is opposite to the top surface 111 of the semiconductor die 1. The package body 19 optionally comprises a wavelength conversion element 191, which can be excited by the light of the semiconductor die 1 and transfer the light to a light with different wavelength. The package body 19 comprises epoxy, silicone, polyimide (PI), benzocyclobutene (BCB), perfluorocyclobutyl (PFCB), Su8, acrylic resin, poly(methyl methacrylate) (PMMA), polyethylene terephthalate (PET), polycarbonate (PC) or polyetherimide. The wavelength conversion element 191 comprises one or two kinds of inorganic phosphor, organic fluorescent colorant, semiconductor or the combination. The inorganic phosphor comprises but is not limited to be a yellow-green phosphor or a red phosphor. The composition of the yellow-green phosphor can be aluminum oxide (YAG or TAG), silicate, vanadate, alkaline earth metal selenide or metal nitride. The composition of the red phosphor can be fluoride ($K_2TiF_6:Mn^{4+}$, $K_2SiF_6:Mn^{4+}$), silicate, vanadate, alkaline earth metal sulfide, metal oxy-nitride, tungsten molybdate group mixture. The semiconductor comprises a semiconductor material with nano crystal, such as quantum-dot light-emitting material. The quantum-dot light-emitting material can be ZnS, ZnSe, ZnTe, ZnO, CdS, CdSe, CdTe, GaN, GaP, GaSe, GaS, GaAs, AlN, AlP, AlAs, InP, InAs, Te, PbS, InSb, PbTe, PbSe, SbTe, ZnCdSeS, CuInS, $CsPbCl_3$, $CsPbBr_3$ and $CsPbI_3$. The semiconductor die 1' in the embodiment further comprises a reflective layer 15 on the top surface 111, the first bonding pad 112 and the second bonding pad 113, which is similar with the semiconductor die 1 in the first embodiment. The first metal extending part 112E connects to the first bonding pad 112 through an opening of the reflective layer 15, and the second metal extending part 113E connects to the second bonding pad 113 through another opening of the reflective layer 15. However, the reflective layer 15 is insulating material in the present embodiment and reflects the light of the semiconductor die 1' toward the top surface 111 to the direction toward the main light-extraction surface 116' and the package body 19.

The boundary of the current conductive area 31 described above is a continuous outer edge formed by continuous connection of the conductive material C1, C2 or C3 which close to the outer side of the current conductive area 31, such as the black bold line shown in FIG. 2. The boundary of the current blocking area 32 described above is a continuous outer edge formed by continuous connection of the insulating material which close to the outer side of the current blocking area 32. The total areas of the conductive material C1, C2, C3 and the specific area such as the current conducive area 31 or the current blocking area 32 can be calculated by the cross-section microscopic image of the semiconductor device 100, and the calculation can be automatically practiced by computer software.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments described above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A semiconductor device, comprising,
    a semiconductor die comprising a stacking structure, a first bonding pad with a flat top side in a cross-sectional view, positioned away from the stacking structure, and a second bonding pad, wherein a shortest distance between the first bonding pad and the second bonding pad is less than 150 microns;
    a carrier comprising a connecting surface;
    a third bonding pad and a fourth bonding pad on the connecting surface of the carrier; and
    a conductive connecting layer comprising
    a first conductive part formed between the first bonding pad and the third bonding pad, and comprising a first conductive material having a first shape with a width;
    a second conductive part formed between the second bonding pad and the fourth bonding pad, and comprising the first conductive material; and
    a blocking part covering the first conductive part and comprising a second conductive material having a second shape with a diameter less than the width in the cross-sectional view,
    wherein the first shape has a height greater than the diameter, and
    wherein the first conductive part fully covers the top flat side in the cross-sectional view.

2. The semiconductor device of claim 1, wherein the conductive connecting layer comprises an insulating material.

3. The semiconductor device of claim 2, wherein the blocking part is formed outside of the first conductive part and the second conductive part, and a first percentage of a total area of the second conductive material in the blocking part is less than a second percentage of a total area of the first conductive material in the first conductive part and the second conductive part in the cross-sectional view.

4. The semiconductor device of claim 3, wherein the second percentage is between 8% and 75%.

5. The semiconductor device of claim 3, wherein the first percentage is between 2% and 50%.

6. The semiconductor device of claim 3, wherein the first percentage is between 0.1% and 40%.

7. The semiconductor device of claim 2, wherein the insulating material comprises a thermosetting material.

8. The semiconductor device of claim 1, wherein the stacking structure comprises a semiconductor stack, and the semiconductor die comprises a first channel and a second channel, and the first bonding pad and the second bonding pad connect to the semiconductor stack through the first channel and the second channel respectively, wherein contacting areas of the first bonding pad and the semiconductor stack and between the second bonding pad and the semiconductor stack are less than areas of the first bonding pad and the second bonding pad respectively.

9. The semiconductor device of claim 1, wherein the shortest distance is between 15 and 100 µm.

10. The semiconductor device of claim 1, wherein the shortest distance is more than or equal to double of the diameter.

11. The semiconductor device of claim 1, wherein at least one of the first conductive material and the second conductive material comprises a metal alloy composed of at least two elements of bismuth (Bi), tin (Sn), silver (Ag) or indium (In).

12. The semiconductor device of claim 1, wherein at least one of the first conductive material and the second conductive material comprises a first metal and a second metal with a melting point higher than that of the first metal, and a weight percentage of the first metal is less than that of the second metal.

13. The semiconductor device of claim 1, further comprising a reflective wall protruding from and connecting to the connecting surface of the carrier, the reflecting wall defining a concave in which the semiconductor die is located.

14. The semiconductor device of claim 1, wherein semiconductor die has an operation current less than 10 mA.

15. The semiconductor device of claim 1, wherein the first bonding pad comprises a first bonding surface and a first normal direction perpendicular to the first bonding surface, and the third bonding pad comprises a second bonding surface and a second normal direction perpendicular to the second bonding surface, and wherein the first normal direction is substantially parallel with the second normal direction.

16. The semiconductor device of claim 1, wherein the first bonding pad comprises a first bonding surface and a first normal direction perpendicular to the first bonding surface, and the third bonding pad comprises a second bonding surface and a second normal direction perpendicular to the second bonding surface, and wherein a first angle formed between the first normal direction and the second normal direction is not 180 degrees.

17. The semiconductor device of claim 16, wherein the first angle is between 60 and 150 degrees.

18. The semiconductor device of claim 16, wherein the conductive connecting layer comprises an insulating material.

19. The semiconductor device of claim 18, wherein the blocking part comprises a first insulating part among the semiconductor die, the connecting surface and the first conductive part.

20. The semiconductor device of claim 1, wherein the first shape is different from the second shape.

* * * * *